(12) United States Patent
Burger et al.

(10) Patent No.: US 9,947,843 B2
(45) Date of Patent: Apr. 17, 2018

(54) METHOD OF PRODUCING A COVER ELEMENT AND AN OPTOELECTRONIC COMPONENT, COVER ELEMENT AND OPTOELECTRONIC COMPONENT

(71) Applicant: OSRAM Opto Semiconductors GmbH, Regensburg (DE)

(72) Inventors: Markus Burger, Regensburg (DE); Tobias Gebuhr, Regensburg (DE); Ion Stoll, Tegernheim (DE)

(73) Assignee: OSRAM Opto Semiconductors GmbH (DE)

( * ) Notice: Subject to any disclaimer, the term of this patent is extended or adjusted under 35 U.S.C. 154(b) by 14 days.

(21) Appl. No.: 14/908,252

(22) PCT Filed: Jul. 30, 2014

(86) PCT No.: PCT/EP2014/066336
§ 371 (c)(1),
(2) Date: Jan. 28, 2016

(87) PCT Pub. No.: WO2015/014874
PCT Pub. Date: Feb. 5, 2015

(65) Prior Publication Data
US 2016/0155912 A1 Jun. 2, 2016

(30) Foreign Application Priority Data

Jul. 30, 2013 (DE) .................. 10 2013 214 877

(51) Int. Cl.
*H01L 33/00* (2010.01)
*H01L 33/56* (2010.01)
(Continued)

(52) U.S. Cl.
CPC ............ *H01L 33/56* (2013.01); *H01L 33/502* (2013.01); *H01L 33/505* (2013.01); *H01L 33/60* (2013.01);
(Continued)

(58) Field of Classification Search
CPC ....... H01L 33/56; H01L 33/60; H01L 33/502; H01L 33/505; H01L 2933/0083;
(Continued)

(56) References Cited

U.S. PATENT DOCUMENTS

2008/0179611 A1* 7/2008 Chitnis ................ H01L 33/508
257/98
2010/0038665 A1 2/2010 Sugiura et al.
(Continued)

FOREIGN PATENT DOCUMENTS

DE    10 2011 105 374 A1    12/2012
DE    10 2012 217 521 A1    3/2014
(Continued)

OTHER PUBLICATIONS

Notice of Reasons for Rejection dated Feb. 28, 2017, of corresponding Japanese Application No. 2016-530506 in English.
(Continued)

*Primary Examiner* — Phat X Cao
*Assistant Examiner* — Mohammad M Hoque
(74) *Attorney, Agent, or Firm* — DLA Piper LLP (US)

(57) ABSTRACT

A method of producing a cover element for an optoelectronic component includes producing a frame having a multiplicity of openings, wherein the frame is made of a material having embedded particles of $TiO_2$, $ZrO_2$, $Al_2O_3$, AlN, $SiO_2$, or another optically reflective material and/or an embedded colored pigment; introducing a material into a multiplicity of the openings; and dividing the frame.

14 Claims, 5 Drawing Sheets

(51) Int. Cl.
    *H01L 33/50*     (2010.01)
    *H01L 33/60*     (2010.01)
    *H01L 33/48*     (2010.01)

(52) U.S. Cl.
    CPC ...... *H01L 33/486* (2013.01); *H01L 2933/005* (2013.01); *H01L 2933/0041* (2013.01); *H01L 2933/0058* (2013.01); *H01L 2933/0083* (2013.01); *H01L 2933/0091* (2013.01)

(58) Field of Classification Search
    CPC ....... H01L 2933/0091; H01L 2933/005; H01L 2933/0058; H01L 33/486; H01L 2933/0041
    See application file for complete search history.

(56) References Cited

U.S. PATENT DOCUMENTS

| | | |
|---|---|---|
| 2010/0103648 A1 | 4/2010 | Kim et al. |
| 2012/0007131 A1* | 1/2012 | Ueno ............... H01L 33/508 257/98 |
| 2012/0033402 A1* | 2/2012 | Harada ................ H01L 33/504 362/84 |
| 2012/0147478 A1* | 6/2012 | Lee ........................ G02B 3/14 359/666 |

FOREIGN PATENT DOCUMENTS

| | | |
|---|---|---|
| JP | 2005-252168 | 9/2005 |
| JP | 2010-034325 | 2/2010 |
| JP | 2012-038362 | 2/2012 |
| JP | 2013-026590 | 2/2013 |
| JP | 2013026590 A * | 2/2013 |
| WO | 2010/017831 A1 | 2/2010 |
| WO | 2010/067291 A1 | 6/2010 |
| WO | 2010/083929 A1 | 7/2010 |

OTHER PUBLICATIONS

First Office Action dated Jun. 29, 2017, of corresponding Chinese Application No. 201480043437.1 in English.

\* cited by examiner

METHOD OF PRODUCING A COVER ELEMENT AND AN OPTOELECTRONIC COMPONENT, COVER ELEMENT AND OPTOELECTRONIC COMPONENT

TECHNICAL FIELD

This disclosure relates to a method of producing a cover element, a method of producing an optoelectronic component, and an optoelectronic component.

BACKGROUND

Optoelectronic components, for example, light-emitting diode components, for the emission of white light or light of another color are known. It is known to equip such optoelectronic components with optoelectronic semiconductor chips, for example, light-emitting diode chips intended for the emission of electromagnetic radiation with a first wavelength, for example, for emission of electromagnetic radiation with a wavelength in the blue spectral range. In addition, such an optoelectronic component has a converter element that converts a wavelength of a part of the electromagnetic radiation emitted by the optoelectronic semiconductor chip. To this end, the converter element has wavelength-converting particles configured to absorb electromagnetic radiation with a first wavelength and subsequently emit electromagnetic radiation with a second, typically longer, wavelength. The wavelength-converting particles are generally embedded in a matrix material of the converter element, for example, in silicone or a ceramic.

It is known in such optoelectronic components to embed the optoelectronic semiconductor chip and the converter element, arranged on a radiation emission surface of the optoelectronic semiconductor chip, in an optically reflective encapsulation material covering the side surfaces of the optoelectronic semiconductor chip and the converter element. The encapsulation material may, for example, comprise silicone with embedded scattering particles. To prevent contamination of an upper side used as a light exit surface of the converter element with the encapsulation material, it is necessary to configure the converter element with essentially perpendicular side surfaces and sharp outer edges. Those requirements are difficult to fulfill in converter elements with a matrix material based on silicone.

It could therefore be helpful to provide a method of producing a cover element for an optoelectronic component, provide a method of producing an optoelectronic component and provide an optoelectronic component.

SUMMARY

We provide a method of producing a cover element for an optoelectronic component including producing a frame having a multiplicity of openings, wherein the frame is made of a material having embedded particles of $TiO_2$, $ZrO_2$, $Al_2O_3$, AlN, $SiO_2$, or another optically reflective material and/or an embedded colored pigment; introducing a material into a multiplicity of the openings; and dividing the frame.

We also provide a method of producing an optoelectronic component including producing a cover element by the method of producing a cover element for an optoelectronic component including producing a frame having a multiplicity of openings, wherein the frame is made of a material having embedded particles of $TiO_2$, $ZrO_2$, $Al_2O_3$, AlN, $SiO_2$, or another optically reflective material and/or an embedded colored pigment; introducing a material into a multiplicity of the openings; and dividing the frame; providing an optoelectronic semiconductor chip; and arranging the cover element on a radiation emission surface of the optoelectronic semiconductor chip.

We further provide an optoelectronic component including an optoelectronic semiconductor chip having a radiation emission surface, and a cover element arranged on the radiation emission surface, wherein the cover element includes a first section having a first material, and includes a second section having a second material different from the first material, at least the first material has embedded wavelength-converting particles, and the second material has embedded particles of $TiO_2$, $ZrO_2$, $Al_2O_3$, AlN, $SiO_2$, or another optically reflective material and/or an embedded colored pigment.

Figure 1:
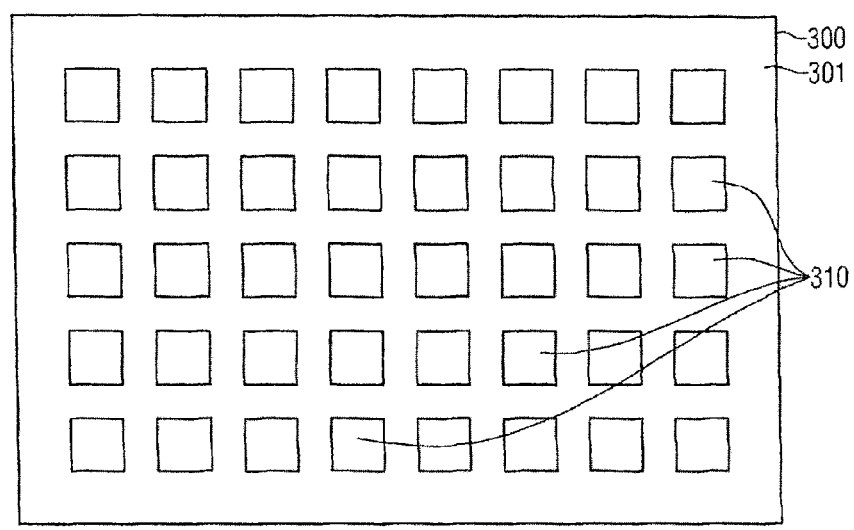
FIG. 1 shows a plan view of a frame.

LIST OF REFERENCES 10 first cover element
20 second cover element
100 first optoelectronic component
200 second optoelectronic component
300 frame
301 upper side
302 lower side
310 opening
320 separating plane
400 converter material
500 portion
501 upper side
502 lower side
503 side surface
510 first section
520 second section
530 separating trench
540 recess
600 optoelectronic semiconductor chip
601 radiation emission surface
602 lower side
603 side surface
700 carrier
701 surface
800 encapsulation material
801 upper side

DETAILED DESCRIPTION

Our method of producing a cover element for an optoelectronic component comprises producing a frame having a multiplicity of openings, introducing a material into a multiplicity of the openings, and dividing the frame. Advantageously, a multiplicity of cover elements can be simultaneously produced in a common working step. The method therefore allows economical mass production of cover elements. In this case, the individual cover elements are individualized by division of the frame. Since the division of the frame allows generation of essentially perpendicular cut surfaces and sharp edges, the cover elements obtained by the method can advantageously have essentially perpendicular side surfaces and sharp outer edges.

The frame may be produced by injection molding or transfer molding. As an alternative, the frame may also be produced by another molding process. Advantageously, the method therefore allows economical and highly reproducible production of the frame.

The frame may be made of a matrix material comprising a silicone or an epoxy resin. Advantageously, these materials are economically available and have suitable material properties.

The frame may be made of a material having embedded particles of $TiO_2$, $ZrO_2$, $Al_2O_3$, AlN, $SiO_2$, or another optically reflective material and/or an embedded colored pigment. Advantageously, a white and optically reflective appearance or a colored appearance may thus be imparted to the frame. In addition, the frame may also have a wavelength-converting property or an appearance similar to the material introduced into the openings of the frame.

The material may be introduced into the openings by blading, spraying or dispensing. Advantageously, this allows the method to be carried out in an economical and reproducible way.

The material may have embedded wavelength-converting particles. The wavelength-converting particles may, for example, be present in the form of organic or inorganic luminescent material or in the form of quantum dots. The cover element obtained by the method may then be used as a converter element of wavelength conversion of electromagnetic radiation resulting from the cover element.

The material may be introduced into the openings as a paste. In this way, the material can advantageously be straightforwardly processed. Furthermore, it is possible to carry out the method in an economical way.

The openings may be respectively formed with an essentially rectangular cross-sectional surface. Advantageously, cover elements with an essentially rectangular shape can therefore be obtained by the method. This makes it possible to use the cover elements in combination with optoelectronic semiconductor chips having an essentially rectangular radiation emission surface. In this case, the radiation emission surface is advantageously covered essentially fully by the cover element which can be obtained by the method.

Division of the frame may be carried out by sawing, laser separation, cutting or stamping. Advantageously, these methods of dividing the frame make it possible to produce essentially perpendicular dividing surfaces with sharp edges. In this way, the cover elements obtained by the method also have essentially perpendicular side surfaces and sharp edges.

The frame may be produced such that the openings are regularly arranged. Advantageously, this allows particularly straightforward individualization of the cover elements which can be obtained by the method.

The frame may be divided such that portions with respectively one opening are formed. Advantageously, each of the portions then forms a cover element suitable for use in combination with an optoelectronic semiconductor chip.

The frame may be divided such that at least one portion is formed having an opening annularly bordered by a section of the frame. Advantageously, the frame section annularly bordering the opening may have essentially perpendicular side surfaces and sharp edges. Furthermore, the section, annularly bordering the opening, of a portion forming a cover element may form a part of a reflector, a part of a lateral border of a light-emitting surface of an optoelectronic component (shutter) or a wavelength-converting part of the cover element.

Before division of the frame, for a multiplicity of openings, the material introduced into the opening may be divided. In this case, for example, a corner region of the material may be separated from the other parts of the material of an opening. The cover elements obtained by the method then have a recess in their corner regions which may, for example, be intended to keep free a bonding surface of an optoelectronic semiconductor chip.

Division of the material may be carried out by boring, stamping, sawing, cutting, water-jet cutting or a laser process. Advantageously, these method steps can be carried out precisely, economically and rapidly.

The frame may be treated with a plasma before the material is introduced. Advantageously, this may improve adhesion between the material introduced into the openings of the frame and the material of the frame.

Introduction of the material may be carried out before the frame is fully cured. Advantageously, this may also improve adhesion between the material of the frame and the material introduced into the openings of the frame.

A method of producing an optoelectronic component comprises producing a cover element by a method of the aforementioned type, providing an optoelectronic semiconductor chip, and arranging the cover element on a radiation emission surface of the optoelectronic semiconductor chip. Advantageously, the cover element of the optoelectronic component obtained by this method can have essentially perpendicular side surfaces and sharp edges.

The method may comprise further steps of arranging the optoelectronic semiconductor chip on a surface of a carrier, and arranging an encapsulation material on the surface of the carrier such that side surfaces of the optoelectronic semiconductor chip and the cover element are at least partially covered by the encapsulation material. Since the cover element of the optoelectronic component obtained by this method can have essentially perpendicular side surfaces and sharp edges, during arrangement of the encapsulation material there is advantageously only a low risk that encapsulation material will reach an upper side, intended for the exit of electromagnetic radiation, of the cover element. The method therefore allows a high yield in the production of optoelectronic components.

A cover element for an optoelectronic component comprises a first section having a first material, and comprises a second section having a second material different from the first material. Advantageously, the first material of the first section and the second material of the second section of the cover element may have different mechanical properties and fulfill different requirements placed on the cover element. In particular, the second material may form essentially perpendicular outer surfaces and sharp edges of the cover element.

At least the first material may have embedded wavelength-converting particles. The first material having the embedded wavelength-converting particles may thus be used for wavelength conversion of electromagnetic radiation resulting from the cover element. The second material has embedded particles of $TiO_2$, $ZrO_2$, $Al_2O_3$, AlN, $SiO_2$, or another optically reflective material and/or an embedded colored pigment.

An optoelectronic component comprises an optoelectronic semiconductor chip having a radiation emission surface. The optoelectronic component furthermore comprises a cover element of the aforementioned type arranged on the radiation emission surface. Advantageously, the cover element of this optoelectronic component may have essentially perpendicular side surfaces and sharp edges.

The above-described properties, features and advantages, as well as the way in which they are achieved, will become more clearly and comprehensively understandable in connection with the following description of the examples, which will be explained in more detail in connection with the drawings.

Figure 2:
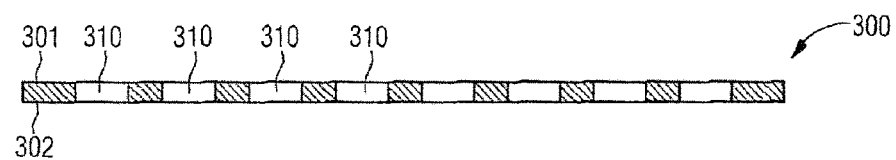
FIG. 2 shows a sectional side view of the frame.

FIG. 1 shows a schematic plan view of a frame 300. FIG. 2 shows a schematic sectional side view of the frame 300. The frame 300 forms an intermediate product during production of a cover element for an optoelectronic component.

The frame 300 is configured as an essentially flat platelet and has an upper side 301 and a lower side 302 lying opposite the upper side 301. The frame 300 furthermore has a multiplicity of openings 310 that respectively extend from the upper side 301 through the frame 300 to the lower side 302. In the example, the openings 310 are arranged in a regular grid with rows and columns, although this is not absolutely necessary. Each opening 310 has an essentially cylindrical shape. The openings 310 have approximately square cross-sectional surfaces. The opening surfaces of the openings 310 at the upper side 301 and the lower side 302 of the frame 300 are therefore also configured approximately squarely in each case. It would, however, also be possible to configure the openings 310 with only rectangular cross-sectional surfaces or with differently shaped cross-sectional surfaces.

The frame 300 may, for example, be produced by a molding process, preferably in particular by injection molding or transfer molding.

The frame 300 has a matrix material. The matrix material preferably comprises silicone, although it may also comprise an epoxy resin or another material. The matrix material of the frame 300 is filled with a filler material. The filler material is preferably embedded in the form of particles in the matrix material of the frame 300.

The filler material may, for example, be a highly optically reflective material, for example, $TiO_2$, $ZrO_2$, $Al_2O_3$, AlN, $SiO_2$. In this case, the frame 300 has a white appearance and good optical reflection properties.

As an alternative or in addition, however, the filler material may also comprise one or more colored pigments. For example, the filler material may comprise inorganic pigments. In this case, the frame 300 may have a color other than white.

Wavelength-converting particles configured to convert a wavelength of electromagnetic radiation may also be embedded in the matrix material of the frame 300. The wavelength-converting particles may be formed by an organic or inorganic luminescent material, for example, and may also comprise quantum dots. In this case, the frame 300 has a wavelength-converting property. Electromagnetic radiation with a first wavelength, which strikes the frame 300, is at least partially absorbed by the wavelength-converting particles. The wavelength-converting particles embedded in the matrix material of the frame 300 subsequently emit electromagnetic radiation of a different, typically longer, wavelength.

Figure 3:
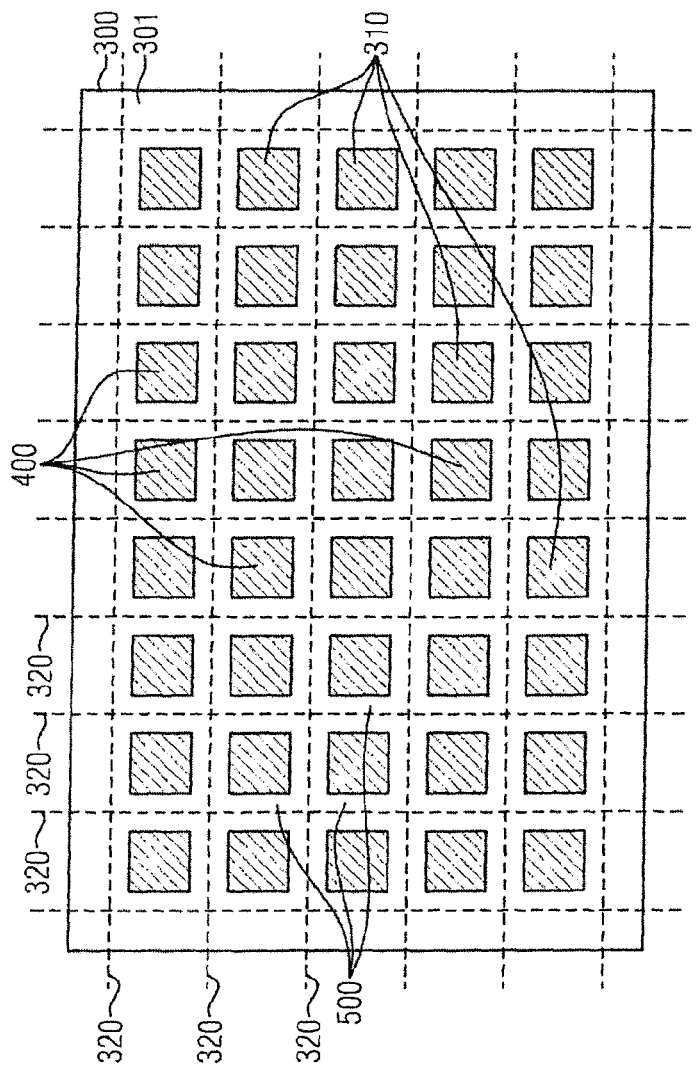
FIG. 3 shows a plan view of the frame with converter material introduced into openings in the frame.
Figure 4:
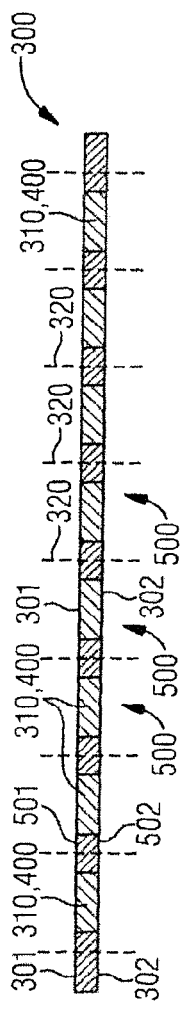
FIG. 4 shows a sectional side view of the frame with the converter material introduced into the openings.

FIG. 3 shows a plan view of the frame 300 in a processing state chronologically following the representation of FIG. 1. FIG. 4 shows a schematic sectional side view of the frame 300 in the processing state shown in FIG. 3.

A converter material 400 has been introduced into the openings 310 of the frame 300. The converter material 400 fills the openings 310 of the frame 300 essentially fully. At the upper side 301 of the frame 300 and at the lower side 302 of the frame 300, the converter material 400 arranged in the openings 310 is essentially flush with the upper side 301 and the lower side 302 of the frame 300.

The converter material 400 may, for example, have been introduced into the openings 310 of the frame 300 by blading, spraying or a dosing technique (dispensing). The blading method in which the converter material 400 is spread into the openings 310 of the frame 300 by a blade in a similar way as in a screen printing method, can be carried out particularly straightforwardly and takes little time.

The converter material 400 is preferably introduced into the openings 310 of the frame 300 in the form of a paste with embedded wavelength-converting particles. The paste forming the converter material 400 may, for example, be a silicone paste. The wavelength-converting particles may, for example, be present as organic or inorganic luminescent material or in the form of quantum dots. The wavelength-converting particles are configured to absorb electromagnetic radiation with a first wavelength and in turn emit electromagnetic radiation with a different, typically longer, wavelength.

After the converter material 400 has been introduced into the openings 310 of the frame 300, the converter material 400 arranged in the openings 310 may be cured. Curing the converter material 400 may, for example, be carried out by a thermal and/or chemical treatment. Preferably, a mechanically stable connection between the converter material 400 arranged in the openings 310 and the material of the frame 300 is formed during the curing of the converter material 400.

Introduction of the converter material 400 into the openings 310 of the frame 300 may already be carried out before a lattice structure of the matrix material of the frame 300 is fully cured after production of the frame 300. This can improve bonding between the converter material 400 introduced into the openings 310 of the frame 300 and the material of the frame 300. As an alternative or in addition, a treatment of the frame 300 with a plasma may be carried out between production of the frame 300 and introduction of the converter material 400 into the openings 310 of the frame 300. In this way, the surface of the frame 300 can be modified, particularly in the region of the openings 310 such that a particularly stable connection is formed between the converter material 400 introduced into openings 310 of the frame 300 and the frame 300.

After curing the converter material 400 introduced into the openings 310 of the frame 300, the frame 300 can be divided to obtain a multiplicity of portions 500. Division of the frame 300 may, for example, be carried out by sawing, laser separation, cutting, water jet cutting or stamping. The frame 300 is in this case divided along separating planes 320 indicated schematically in FIGS. 3 and 4. In the example represented, the separating planes 320 extend between the rows and columns of the regular arrangement of openings 310 of the frame 300 such that each resulting portion 500 comprises one opening 310 of the frame 300.

Figure 5:
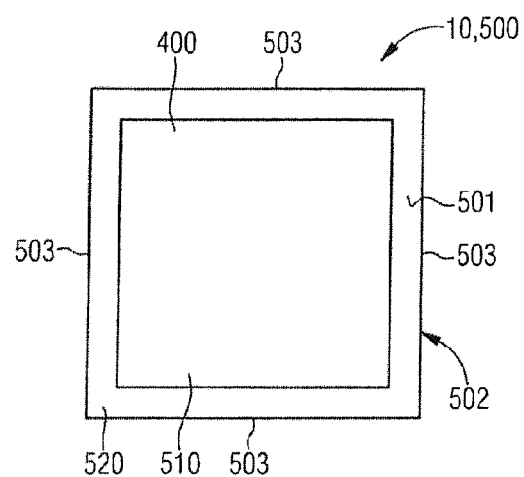
FIG. 5 shows a plan view of a portion of the frame forming a first cover element.

FIG. 5 shows a schematic plan view of a portion 500 obtained by division of the frame 300. The portion 500 forms a first cover element 10.

The first cover element 10 formed by the portion 500 has an upper side 501 and a lower side 502 lying opposite the upper side 501. The upper side 501 of the portion 500 is formed by a part of the upper side 301 of the frame 300. The lower side 502 of the portion 500 is formed by a part of the lower side 302 of the frame 300.

Furthermore, the first cover element 10 formed by the portion 500 has side surfaces 503 having been formed by the division of the frame 300 along the separating planes 320. The side surfaces 503 formed by the division of the frame 300 of the portion 500 are essentially configured straight and oriented perpendicularly to the upper side 501 and the lower side 502 of the portion 500. The edges of the portion 500 formed at the boundaries between the side surfaces 503 and the upper side 501 and at the boundaries between the side surfaces 503 and the lower side 502 of the portion 500, are configured sharply and rounded only to a small extent.

The first cover element 10 formed by the portion 500 of the frame 300 comprises one of the openings 310 of the frame 300 filled with converter material 400. This opening 310 formed with converter material 400 forms a first section 510 of the first cover element 10 formed by the portion 500. The first section 510, formed by the opening filled with converter material 400, of the portion 500 is annularly bordered by a second section 520 of the portion 500 formed from a part of the frame 300. The first cover element 10 formed by the portion 500 therefore has the converter material 400 in the first section 510. In the second section 520, the first cover element 10 formed by the portion 500 has the material of the frame 300.

Figure 6:
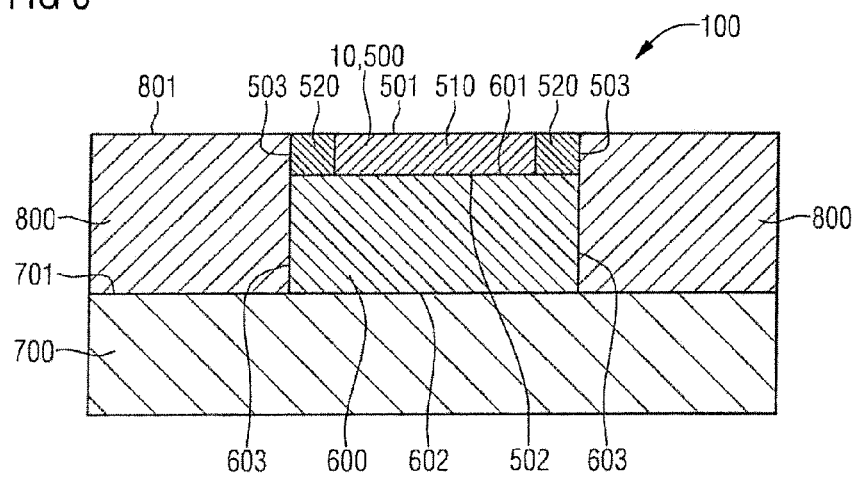
FIG. 6 shows a sectional side view of a first optoelectronic component.

FIG. 6 shows a schematic sectional side view of a first optoelectronic component 100. The first optoelectronic component 100 may, for example, be a light-emitting diode component.

The first optoelectronic component 100 comprises a carrier 700 with a surface 701. The carrier 700 may also be referred to as a substrate.

An optoelectronic semiconductor chip 600 is arranged on the surface 701 of the carrier 700. The optoelectronic semiconductor chip 600 may, for example, be a light-emitting diode chip (LED chip). The optoelectronic semiconductor chip 600 has a radiation emission surface 601 and a lower side 602 lying opposite the radiation emission surface 601. The optoelectronic semiconductor chip 600 furthermore has side surfaces 603 that extend between the lower side 602 and the radiation emission surface 601 of the optoelectronic semiconductor chip 600.

The optoelectronic semiconductor chip 600 is configured to emit electromagnetic radiation at its radiation emission surface 601. For example, the optoelectronic semiconductor chip 600 may be configured to emit electromagnetic radiation with a wavelength from the blue spectral range at its radiation emission surface 601.

On its lower side 602, the optoelectronic semiconductor chip 600 has electrical contacts used to conduct electric current through the optoelectronic semiconductor chip 600 during operation of the optoelectronic semiconductor chip 600. The optoelectronic semiconductor chip 600 may, for example, be configured as a flip-chip.

The optoelectronic semiconductor chip 600 is arranged on the surface 701 of the carrier 700 such that the lower side 602 of the optoelectronic semiconductor chip 600 faces toward the surface 701 of the carrier 700. The electrical contacts arranged on the lower side 602 of the optoelectronic semiconductor chip 600 are in electrically conductive connection with mating contacts arranged on the surface 701 of the carrier 700.

The first cover element 10 formed by the portion 500 is arranged on the radiation emission surface 601 of the optoelectronic semiconductor chip 600. In this case, the lower side 502 of the first cover element 10 faces toward the radiation emission surface 601 of the optoelectronic semiconductor chip 600.

The lower side 502 of the first cover element 10 is essentially the same size as the radiation emission surface 601 of the optoelectronic semiconductor chip 600. The radiation emission surface 601 of the optoelectronic semiconductor chip 600 is therefore covered essentially fully by the first cover element 10, without the first cover element 10 extending beyond the side surfaces 603 of the optoelectronic semiconductor chip 600. The side surfaces 503 of the first cover element 10 formed by the portion 500 are essentially flush with the side surfaces 603 of the optoelectronic semiconductor chip 600.

It is also possible to configure the first cover element 10 such that the first section 510 of the first cover element 10 is essentially the same size as the radiation emission surface 601 of the optoelectronic semiconductor chip 600. In this case, the radiation emission surface 601 of the optoelectronic semiconductor chip 600 is essentially covered fully by the first section 510 of the first cover element 10. The first cover element 10 then extends beyond the side surfaces 603 of the optoelectronic semiconductor chip 600.

The first cover element 10 may, for example, be fastened on the radiation emission surface 601 of the optoelectronic semiconductor chip 600 by an optically transparent adhesive. Arrangement of the first cover element 10 on the radiation emission surface 601 of the optoelectronic semiconductor chip 600 may already be carried out before the optoelectronic semiconductor chip 600 is arranged on the surface 701 of the carrier 700. As an alternative, however, the first cover element 10 may also not have been arranged on the radiation emission surface 601 of the optoelectronic semiconductor chip 600 until after the optoelectronic semiconductor chip 600 is arranged on the surface 701 of the carrier 700.

The optoelectronic semiconductor chip 600 and the first cover element 10 are embedded in an encapsulation material 800 arranged on the surface 701 of the carrier 700 of the first optoelectronic component 100. The encapsulation material 800 covers the side surfaces 603 of the optoelectronic semiconductor chip 600 and the side surfaces 503 of the first cover element 10 essentially fully.

The upper side 501 of the first cover element 10, however, is not covered by the encapsulation material 800. An upper side 801, facing away from the surface 701 of the carrier 700, of the encapsulation material 800 is essentially flush with the upper side 501 of the first cover element 10. During encapsulation of the optoelectronic semiconductor chip 600 and the first cover element 10 with the encapsulation material 800, contamination of the upper side 501 of the first cover element 10 was prevented by the essentially straight and perpendicular side surfaces 503 of the first cover element 10 and the sharp edges between the upper side 501 and the side surfaces 503 of the first cover element 10.

The encapsulation material 800 may, for example, comprise silicone filled with an optically reflective filler, for example, with filler particles comprising $TiO_2$, $ZrO_2$, $Al_2O_3$, AlN or $SiO_2$.

Figure 7:
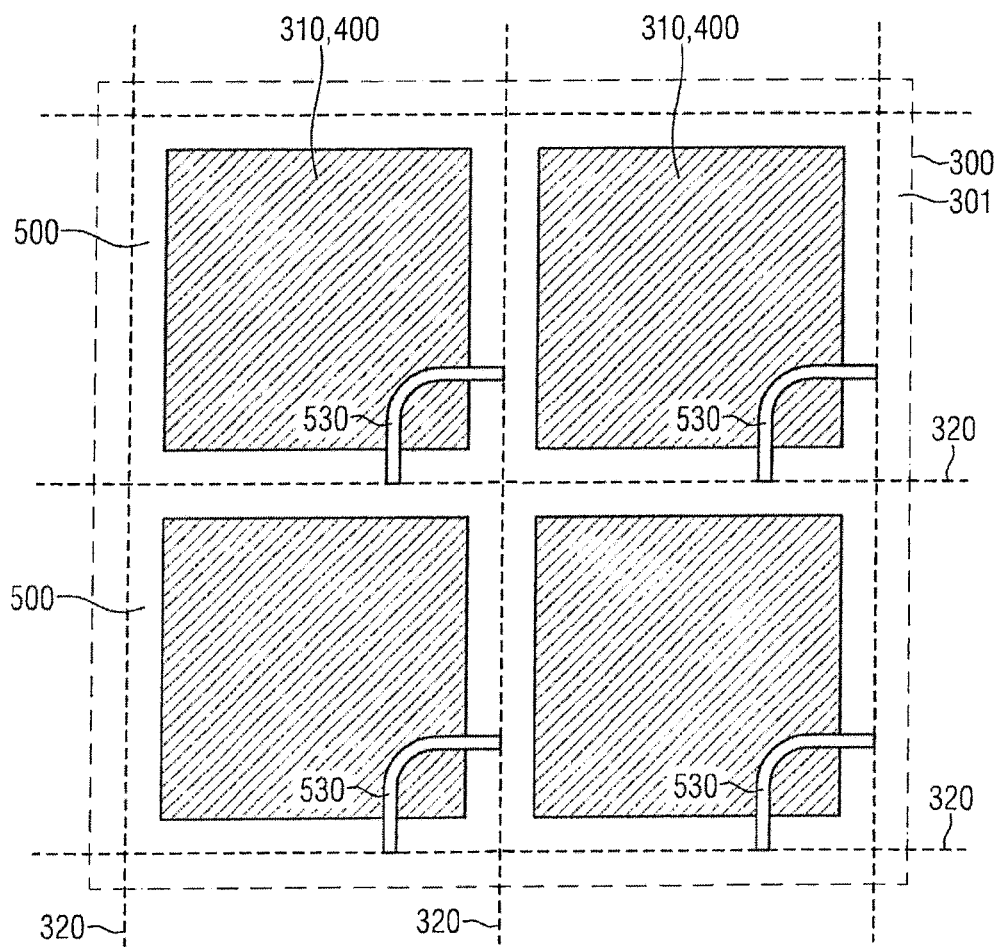
FIG. 7 shows a plan view of the frame with introduced separating trenches.

FIG. 7 shows a schematic plan view of the frame 300 with the openings 310 filled with converter material 400 in a processing state chronologically following the representation of FIG. 3, after an optional additional processing step has been carried out. In this processing step, a separating trench 530 was applied in each of the as yet undivided portions 500 of the frame 300. Each separating trench 530 extends fully through the frame 300 in the vertical direction between the upper side 301 of the frame 300 and the lower side 302 of the frame 300. Each separating trench 530 extends through the converter material 400 arranged in the opening 310 of the respective portion 500 and separates a part of the converter material 400 in a corner region of the opening 310 from the rest of the converter material 400 in the opening 310 of the respective portion 500. Each separating trench 530 extends in the shape of an arc between two mutually perpendicular separating planes 320 of the frame 300. The separating trenches 530 may, for example, have been applied by stamping or a laser process.

Figure 8:
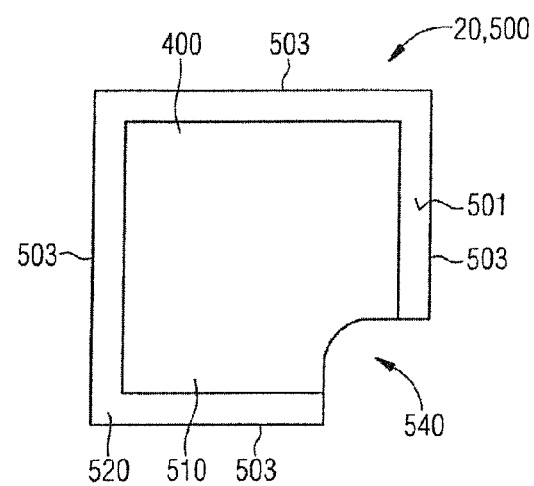
FIG. 8 shows a plan view of a portion of a frame, forming a second cover element with a recess.

FIG. 8 shows a schematic plan view of a portion 500 of the frame 300 shown in FIG. 7 after division of the frame 300 along the separating planes 320. The portion 500 forms a second cover element 20. The region, separated by the separating trench 530 of the converter material 400 in the opening 310 of the portion 500 has been fully detached and removed from the remaining part of the portion 500 after division of the frame 300 along the separating planes 320. The portion 500 therefore has a recess 540 in a corner region. This recess 540 extends over the entire height of the portion 500 between its lower side 502 and its upper side 501. The recess 540 comprises a part of the first section 510 and a part of the second section 520 of the second cover element 20 formed by the portion 500. In other regards, the second cover element 20 is configured like the first cover element 10 of FIG. 5.

Application of the separating trench 530 and individualization of the portions 500 by division of the frame 300 along the separating planes 320 are carried out in two separate working steps. It is, however, also possible to simultaneously apply the separating trenches 530 with the division of the frame 300 along the separating planes 320, for example, by a method of free-form individualization of the portions 500. Another possibility is to apply the recess 540 before division of the frame 300, for example, by boring. In this case, application of separating trenches 530 may be omitted.

Figure 9:
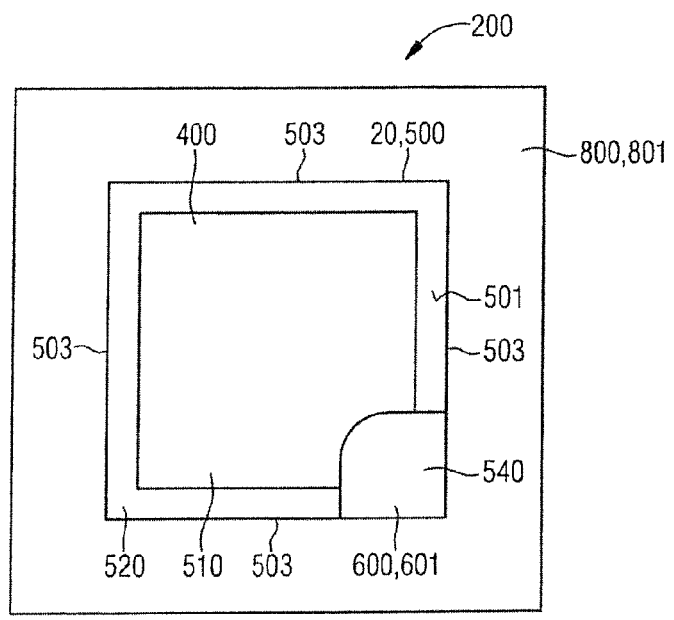
FIG. 9 shows a plan view of a second optoelectronic component.

FIG. 9 shows a schematic plan view of a second optoelectronic component 200. The second optoelectronic component 200 may, for example, be a light-emitting diode component. The second optoelectronic component 200 has correspondences with the first optoelectronic component 100 of FIG. 6. Corresponding parts are provided with the same references in FIGS. 6 and 9 and will not be described again in detail below. In what follows, only the differences between the second optoelectronic component 200 and the first optoelectronic component 100 will be explained.

Instead of the first cover element 10, the second optoelectronic component 200 has the second cover element 20. The second cover element 20 is arranged on the radiation emission surface 601 of the optoelectronic semiconductor chip 600 of the second optoelectronic component 200 and covers it substantially fully. Only in the region of the recess 540 of the second cover element 20 does the second cover element 20 not cover the radiation emission surface 601 of the optoelectronic semiconductor chip 600 of the second optoelectronic component 200.

An electrical contact pad of the optoelectronic semiconductor chip 600 may be arranged in the part, of the radiation emission surface 601 of the optoelectronic semiconductor chip 600 of the second optoelectronic component 200, not covered by the second cover element 20 in the region of the recess 540 of the second cover element 20. In this case, for example, the optoelectronic semiconductor chip 600 may be configured as a top emitter. A bonding wire may then, for example, be arranged in the region remaining free because of the recess 540 of the second cover element 20.

The recess 540 of the second cover element 20 may also be arranged at a position other than in a corner region. It is also possible to provide more than one recess.

Instead of the converter material 400, a different material without embedded wavelength-converting particles may also be introduced into the openings 310 of the frame 300. The material introduced into the openings 310 of the frame 300 may also have a different filler, for example, $TiO_2$ or $SiO_2$. The cover elements 10, 20 are then not used for wavelength conversion, but merely for covering.

Our methods, cover elements and components have been illustrated and described in detail with the aid of the preferred examples. This disclosure is nevertheless not restricted to the examples disclosed. Rather, other variants may be derived therefrom by those skilled in the art, without departing from the protective scope of the appended claims.

This application claims priority of DE 10 2013 214 877.1, the disclosure of which is incorporated herein by reference.

The invention claimed is:

1. A method of producing a cover element for an optoelectronic component, comprising:
   producing a frame having a multiplicity of openings, wherein the frame is made of a matrix material having embedded particles of $TiO_2$, $ZrO_2$, $Al_2O_3$, AlN, $SiO_2$, or another optically reflective material and/or an embedded colored pigment;
   introducing a converter material into a multiplicity of the openings; and
   dividing the frame such that portions with respectively exactly one opening are formed;
   wherein, before dividing the frame, for a multiplicity of openings the converter material introduced into the opening is divided.

2. The method as claimed in claim 1, wherein the frame is produced by injection molding or transfer molding.

3. The method as claimed in claim 1, wherein the frame is made of a matrix material comprising a silicone or an epoxy resin.

4. The method as claimed in claim 1, wherein the converter material is introduced into the openings by blading, spraying or dispensing.

5. The method as claimed in claim 1, wherein the converter material has embedded wavelength-converting particles.

6. The method as claimed in claim 1, wherein the openings are respectively formed with an essentially rectangular cross-sectional surface.

7. The method as claimed in claim 1, wherein dividing the frame is carried out by sawing, laser separation, cutting or stamping.

8. The method as claimed in claim 1, wherein the frame is produced such that the openings are regularly arranged.

9. The method as claimed in claim 1, wherein, before dividing the frame, for a multiplicity of openings the material introduced into the opening is divided.

10. The method as claimed in claim 1, wherein dividing the converter material is carried out by boring, stamping, sawing, cutting, water jet cutting or a laser process.

11. The method as claimed in claim 1, wherein the frame is treated with a plasma before the converter material is introduced.

12. The method as claimed in claim 1, wherein introducing the converter material is carried out before the frame is fully cured.

13. A method of producing an optoelectronic component, comprising:
    producing a cover element by a method as claimed in claim 1;
    providing an optoelectronic semiconductor chip; and
    arranging the cover element on a radiation emission surface of the optoelectronic semiconductor chip.

14. The method as claimed in claim 13, further comprising:
    arranging the optoelectronic semiconductor chip on a surface of a carrier;
    arranging an encapsulation material on the surface of the carrier such that side surfaces of the optoelectronic semiconductor chip and the cover element are at least partially covered by the encapsulation material.

* * * * *